US010007308B2

(12) United States Patent
Mongia et al.

(10) Patent No.: US 10,007,308 B2
(45) Date of Patent: Jun. 26, 2018

(54) APPARATUS AND METHOD TO EFFICIENTLY COOL A COMPUTING DEVICE

(71) Applicant: Intel Corporation, Santa Clara, CA (US)

(72) Inventors: Rajiv K. Mongia, Fremont, CA (US); Sridhar V. Machiroutu, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/711,638

(22) Filed: May 13, 2015

(65) Prior Publication Data
US 2015/0253824 A1 Sep. 10, 2015

Related U.S. Application Data

(62) Division of application No. 11/244,496, filed on Sep. 30, 2005, now Pat. No. 9,047,066.

(51) Int. Cl.
*H05K 7/20* (2006.01)
*G06F 1/20* (2006.01)
*H01L 23/467* (2006.01)

(52) U.S. Cl.
CPC ............ *G06F 1/203* (2013.01); *H01L 23/467* (2013.01); *H05K 7/20145* (2013.01); *H01L 2924/0002* (2013.01)

(58) Field of Classification Search
CPC . G06F 1/203; H05K 7/20127–7/20145; H01L 23/4375
See application file for complete search history.

(56) References Cited

U.S. PATENT DOCUMENTS

| 4,277,816 | A | * | 7/1981 | Dunn | ................... H01L 23/467 165/80.3 |
| 4,399,484 | A | * | 8/1983 | Mayer | ................ H05K 7/20345 165/908 |
| 4,661,669 | A | | 4/1987 | Matsushima et al. | |
| 4,726,285 | A | * | 2/1988 | Kelley | ................. F24F 13/068 454/284 |

(Continued)

FOREIGN PATENT DOCUMENTS

| DE | 202004003310 U | 8/2004 |
| TW | I229790 | 3/2005 |

OTHER PUBLICATIONS

Garino et al., Characterization for Laminar Jet Impingement Cooling in Portable Computer Applications, IEEE Transactions on Components and Packaging Technologies, vol. 23, No. 3, Sep. 2002, pp. 337-346.*

(Continued)

*Primary Examiner* — Robert J Hoffberg
(74) *Attorney, Agent, or Firm* — Patent Capital Group

(57) ABSTRACT

Embodiments disclosed herein include devices to cool the walls of a mobile computing device. In one embodiment, a louvered vent is formed within an external wall of a mobile computing device to create an air curtain between the external wall and a heat generating component to cool the external wall. In another embodiment, a nozzle vent is formed within the external wall of a mobile computing device to flow cooling air at a heat generating component to cool the heat generating component.

18 Claims, 6 Drawing Sheets

(56) References Cited

U.S. PATENT DOCUMENTS

| | | | |
|---|---|---|---|
| 4,897,762 A | 1/1990 | Daikoku et al. | |
| 4,949,218 A | 8/1990 | Blanchard et al. | |
| 5,063,476 A * | 11/1991 | Hamadah | H01L 23/467 257/E23.099 |
| 5,259,817 A | 11/1993 | Schumacher et al. | |
| 5,285,350 A * | 2/1994 | Villaume | H01L 23/3672 165/80.3 |
| 5,313,362 A | 5/1994 | Hatada et al. | |
| 5,331,508 A | 7/1994 | Hosoi et al. | |
| 5,424,915 A | 6/1995 | Katooka et al. | |
| 5,428,503 A * | 6/1995 | Matsushima | H05K 7/20154 165/908 |
| 5,519,585 A | 5/1996 | Jones et al. | |
| 5,563,768 A | 10/1996 | Perdue | |
| 5,694,294 A | 12/1997 | Ohashi et al. | |
| 5,953,206 A | 9/1999 | Jondrow | |
| 6,005,770 A | 12/1999 | Schmitt | |
| 6,027,535 A | 2/2000 | Eberle et al. | |
| 6,069,791 A | 5/2000 | Goto et al. | |
| 6,175,495 B1 | 1/2001 | Batchelder | |
| 6,181,557 B1 | 1/2001 | Gatti | |
| 6,226,180 B1 | 5/2001 | Ueda et al. | |
| 6,226,182 B1 | 5/2001 | Maehara | |
| 6,229,701 B1 | 5/2001 | Kung et al. | |
| 6,237,144 B1 | 5/2001 | Delo | |
| 6,243,261 B1 | 6/2001 | Janik et al. | |
| 6,252,160 B1 | 6/2001 | Chang et al. | |
| 6,259,601 B1 | 7/2001 | Jaggers et al. | |
| 6,336,691 B1 | 1/2002 | Maroney et al. | |
| 6,348,653 B1 | 2/2002 | Cho | |
| 6,364,009 B1 | 4/2002 | MacManus et al. | |
| 6,385,043 B1 | 5/2002 | Ueda et al. | |
| 6,421,238 B1 | 7/2002 | Negishi | |
| 6,430,042 B1 | 8/2002 | Ohashi et al. | |
| 6,459,573 B1 | 10/2002 | Distefano et al. | |
| 6,459,574 B1 | 10/2002 | Ghosh | |
| 6,507,493 B2 | 1/2003 | Ueda et al. | |
| 6,577,502 B1 | 6/2003 | Distefano et al. | |
| 6,588,497 B1 | 7/2003 | Glezer et al. | |
| 6,599,090 B2 * | 7/2003 | Ozaki | G06F 1/203 361/679.21 |
| 6,618,248 B1 | 9/2003 | Dalheimer | |
| 6,678,157 B1 | 1/2004 | Bestwick | |
| 6,717,808 B2 | 4/2004 | Ueda et al. | |
| 6,724,624 B1 | 4/2004 | Dodson | |
| 6,760,649 B2 | 7/2004 | Cohen | |
| 6,765,796 B2 | 7/2004 | Hoffman et al. | |
| 6,801,430 B1 | 10/2004 | Pokharna | |
| 6,847,524 B2 | 1/2005 | Tomioka et al. | |
| 6,882,108 B2 * | 4/2005 | Kim | H05K 7/20972 313/46 |
| 6,909,602 B2 | 6/2005 | Dietrich et al. | |
| 6,947,294 B2 | 9/2005 | Lin et al. | |
| 6,972,950 B1 | 12/2005 | Wyatt et al. | |
| 6,991,533 B2 | 1/2006 | Tsai et al. | |
| 7,031,154 B2 | 4/2006 | Bash et al. | |
| 7,167,363 B1 | 1/2007 | Cushman et al. | |
| 7,173,822 B2 | 2/2007 | Liang et al. | |
| 7,201,651 B2 | 4/2007 | Su | |
| 7,210,946 B2 | 5/2007 | Chen | |
| 7,248,471 B2 | 7/2007 | Wabiszczewicz | |
| 7,251,139 B2 | 7/2007 | Bhattacharya et al. | |
| 7,310,227 B2 | 12/2007 | Kusamoto et al. | |
| 7,312,988 B2 | 12/2007 | Maeda | |
| 7,355,851 B2 | 4/2008 | Lanni | |
| 7,362,574 B2 * | 4/2008 | Campbell | H01L 23/4735 165/104.33 |
| 7,375,962 B2 * | 5/2008 | Campbell | H01L 23/4735 165/104.33 |
| 7,403,385 B2 | 7/2008 | Boone et al. | |
| 7,416,481 B2 | 8/2008 | Baker et al. | |
| 7,529,087 B2 | 5/2009 | Dubrule et al. | |
| 7,764,514 B2 * | 7/2010 | Mongia | H05K 9/0041 174/382 |
| 7,872,865 B2 * | 1/2011 | Matsushima | G11B 33/142 165/104.33 |
| 7,884,468 B2 * | 2/2011 | Mann | H01L 23/4735 257/714 |
| 7,957,140 B2 * | 6/2011 | Mongia | G06F 1/203 165/104.33 |
| 8,169,779 B2 * | 5/2012 | Le | H01L 23/4735 165/104.33 |
| 8,451,600 B1 * | 5/2013 | Ross | H05K 7/20545 165/80.3 |
| 9,047,066 B2 * | 6/2015 | Mongia | G06F 1/203 |
| 9,851,766 B2 * | 12/2017 | Mongia | G06F 1/203 |
| 2002/0122296 A1 | 9/2002 | Stone et al. | |
| 2003/0121645 A1 | 7/2003 | Wang | |
| 2003/0156385 A1 | 8/2003 | Askeland et al. | |
| 2003/0210523 A1 | 11/2003 | Tuttle et al. | |
| 2004/0001316 A1 | 1/2004 | Kamikawa et al. | |
| 2004/0016257 A1 | 1/2004 | Wei | |
| 2004/0027069 A1 | 2/2004 | Kim et al. | |
| 2004/0085730 A1 | 5/2004 | Lo | |
| 2004/0123978 A1 | 7/2004 | Hashimoto et al. | |
| 2004/0125558 A1 | 7/2004 | Distefano | |
| 2004/0130869 A1 | 7/2004 | Fleck et al. | |
| 2004/0217072 A1 | 11/2004 | Bash et al. | |
| 2005/0013116 A1 | 1/2005 | Pokharna et al. | |
| 2005/0111185 A1 | 5/2005 | Bhattacharya et al. | |
| 2005/0207113 A1 | 9/2005 | Tanaka et al. | |
| 2006/0120043 A1 | 6/2006 | Wolford et al. | |
| 2006/0133036 A1 | 6/2006 | Durney | |
| 2006/0193113 A1 | 8/2006 | Cohen et al. | |
| 2006/0198104 A1 | 9/2006 | Chang et al. | |
| 2007/0064388 A1 | 3/2007 | Uchizono et al. | |
| 2007/0076370 A1 | 4/2007 | Mongia et al. | |
| 2008/0117590 A1 | 5/2008 | Dey et al. | |
| 2009/0168332 A1 | 7/2009 | Mongia | |
| 2010/0014247 A1 * | 1/2010 | Wang | H05K 7/20145 361/692 |
| 2012/0069520 A1 * | 3/2012 | Kaneko | G06F 1/203 361/692 |
| 2015/0253824 A1 | 9/2015 | Mongia et al. | |
| 2016/0062420 A1 * | 3/2016 | Mongia | G06F 1/203 361/679.46 |

OTHER PUBLICATIONS

Unknown, Top 9 Laptop Computer Safety Tips, web document, Laptop Computer Safety, 3 pages total, 2005.

First Office Action dated Mar. 23, 2010, Chinese Patent Application No. 200680035883.3.

International Search Report and Written Opinion of the International Searching Authority, jApplication No. PCT/US20061037759 dated Jan. 8, 2007.

Et al, "Characterization of Laminar Jet Impingement Cooling in a Portable Computer Applications", IEEE Transaction on Components and Packaging Technologies, IEEE Service Center, Piscataway, NJ, US, vol. 25, No. 3, Sep. 2002 (Sep. 2009), pp. 337-346.

Office Action received for Chinese Patent Application No. 200680035883.3, dated Oct. 9, 2012, 11 pages including 6 pages English translation.

Vader et al., "Nozzle for Enhanced Impingement Cooling," IP. Com. Journal, IP. Com, Inc., West Henrietta, NY, US, Aug. 1, 1991; number of pp. 3.

Unknown, Streetwise: Power Support—4C Vent Laptop Cooling Stand 17", webdocument, streetwise.com.au, 2 pages, 2005.

Final Office Action in U.S. Appl. No. 11/244,496 dated Jun. 30, 2011, 18 pages.

Final Office Action in U.S. Appl. No. 11/244,496 dated Jan. 2, 2009, 14 pages.

Final Office Action in U.S. Appl. No. 11/244,496 dated Oct. 23, 2009, 16 pages.

Final Office Action in U.S. Appl. No. 11/244,496 dated Sep. 8, 2010, 10 pages.

Non Final Office Action in U.S. Appl. No. 14/919,271 dated Jul. 21, 2016, 14 pages.

(56) References Cited

OTHER PUBLICATIONS

Non Final Office Action in U.S. Appl. No. 11/244,496 dated Apr. 10, 2009, 9 pages.
Non Final Office Action in U.S. Appl. No. 11/244,496 dated Apr. 5, 2010, 16 pages.
Non Final Office Action in U.S. Appl. No. 11/244,496 dated Jan. 24, 2011, 11 pages.
Non Final Office Action in U.S. Appl. No. 11/244,496 dated Jul. 15, 2008, 12 pages.
Notice of Allowance in U.S. Appl. No. 14/919,271 dated Aug. 15, 2017.
Notice of Allowance in U.S. Appl. No. 11/244,496 dated Jan. 30, 2015, 9 pages.

* cited by examiner

APPARATUS AND METHOD TO EFFICIENTLY COOL A COMPUTING DEVICE

CROSS-REFERENCE TO RELATED APPLICATIONS

This application is a division of, claims the benefit of and priority to previously filed U.S. patent application Ser. No. 11/244,496, filed Sep. 30, 2005, entitled "Apparatus and Method to Efficiently Use Cooling Air", the subject matter of which is incorporated herein by reference in its entirety.

BACKGROUND

1. Field

The present invention relates to the field of heat management of computing devices, and in particular the cooling of heat generating components and exterior walls of mobile computing devices.

2. Discussion of Related Art

Heat management can be critical in many applications. Excessive heat can cause damage to or degrade the performance of mechanical, chemical, electric, and other types of devices. Heat management becomes more critical as technology advances and newer devices continue to become smaller and more complex, and as a result run at higher power levels and/or power densities.

Modern electronic circuits, because of their high density and small size, often generate a substantial amount of heat. Complex integrated circuits (ICs), especially microprocessors, generate so much heat that they are often unable to operate without some sort of cooling system. Further, even if an IC is able to operate, excess heat can degrade an IC's performance and can adversely affect its reliability over time. Inadequate cooling can cause problems in central processing units (CPUs) used in personal computers (PCs), which can result in system crashes, lockups, surprise reboots, and other errors. The risk of such problems can become especially acute in the tight confines found inside mobile computers and other portable computing and electronic devices.

As the processing powers of mobile computing devices continue to increase, the temperatures of the outer walls of the mobile computing devices will continue to rise to unacceptable levels. The temperatures are becoming the highest within the regions of the memory, central processing unit (CPU), chipset and voltage regulator (VR). To overcome the increase of heat in these locations, vents have been placed in strategic locations to reduce the temperatures.

Prior methods for dealing with such cooling problems have included using simple vent systems in the outer walls of a mobile device. But, as the amount of cooling air available within mobile computing devices is reduced as the mobile devices are scaled down, the vent system becomes less and less efficient.

DETAILED DESCRIPTION

Described herein are methods and devices to decrease the temperatures of the walls of mobile computing devices and of the components within the mobile computing devices. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Embodiments disclosed herein include devices to cool the walls of a mobile computing device and to cool the heat generating components of the mobile computing device. In one embodiment, a louvered vent is formed within an external wall of a mobile computing device to create an air curtain between the external wall and a heat generating component to cool the external wall. In another embodiment, a nozzle vent is formed within the external wall of a mobile computing device to flow cooling air at a heat generating component to cool the heat generating component.

Figure 1A:
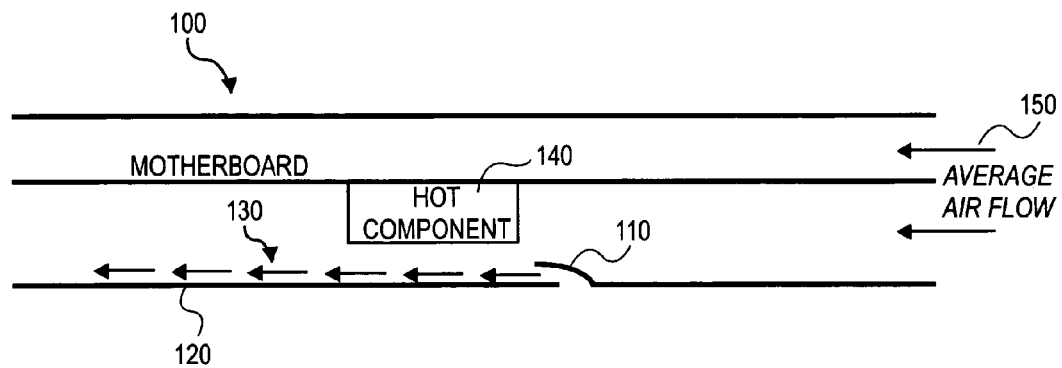
FIG. 1A is an illustration of an embodiment of a cross-sectional view of a louvered vent within a mobile computing device.
Figure 1B:
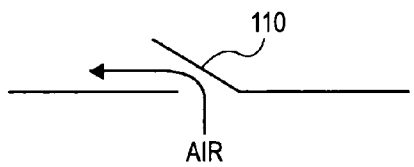
FIGS. 1B-1D illustrate cross-sectional views of different embodiments of the shape of the louvered vent.
Figure 1C:
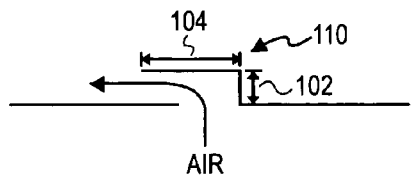
Figure 1D:
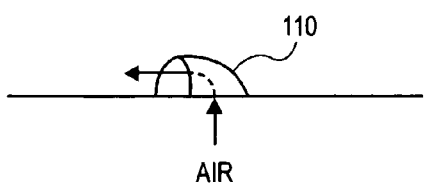

FIG. 1A illustrates an embodiment of a louvered vent 110 that has been formed within the external wall 120 of a mobile computing device 100 to form an air curtain 130 between the external wall 120 and a heat generating component 140 to cool the external wall. An air curtain 130 is a thin film of air that is formed along the inside of the external wall 120. The air curtain 130 is formed inside the mobile computing device 100 to supplement the average airflow 150 available on the inside of the mobile computing device 100. The air curtain 130 is formed by the fluid dynamics of the louvered vent 110. The purpose of the air curtain 130 is to isolate the external wall 120 from the heat generating components 140. The shape of the louvered vent 110 is designed to redirect the flow of the air coming into the mobile computing device 100 from outside of the external wall 120. The louvered vent 110 illustrated in FIG. 1A is a curved louvered vent 110. FIGS. 1B, 1C and 1D illustrate alternative embodiments of the shape of the louvered vent 110.

In FIG. 1B an angled louvered vent 110 is illustrated. The angled louvered vent 110 of FIG. 1B may have any angle with respect to the external wall 120 that is sufficient to form a curtain of cooling air 130, but more particularly may have an angle with respect to the external wall 120 in the approximate range of 15 degrees and 45 degrees.

FIG. 1C illustrates a squared of chamber louvered vent 110. The height 102 of the squared off chamber may vary depending on the dimensions of the interior of the mobile computing device 100, but in one particular embodiment where the mobile computing device 100 is a laptop computer, the height 102 of the squared off chamber may be in the approximate range of 1 millimeters (mm)-3 mm. The length 104 of the squared off chamber louvered vent 110 may be any length sufficient to form the air curtain 130 along the external wall 120.

FIG. 1D illustrates a hooded louvered vent 110. The hooded louvered vent 110 may be curved, angled, or squared and forms an enclosed louvered vent 110 to more specifically focus the air curtain 130. The hooded louvered vent 110 may have a width and a height sufficient to create an air curtain 130 that is capable of reducing the temperature of the external wall 120.

Figure 2A:
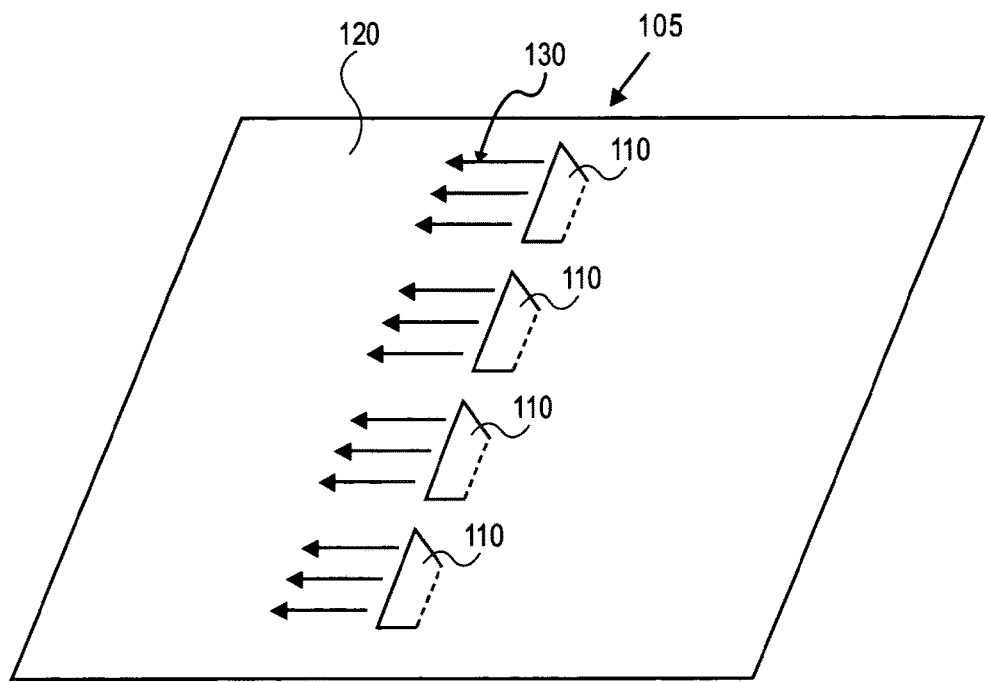
FIG. 2A is an illustration of an overhead view of an embodiment of the inside surface of a wall having a row of louvered vents.
Figure 2B:
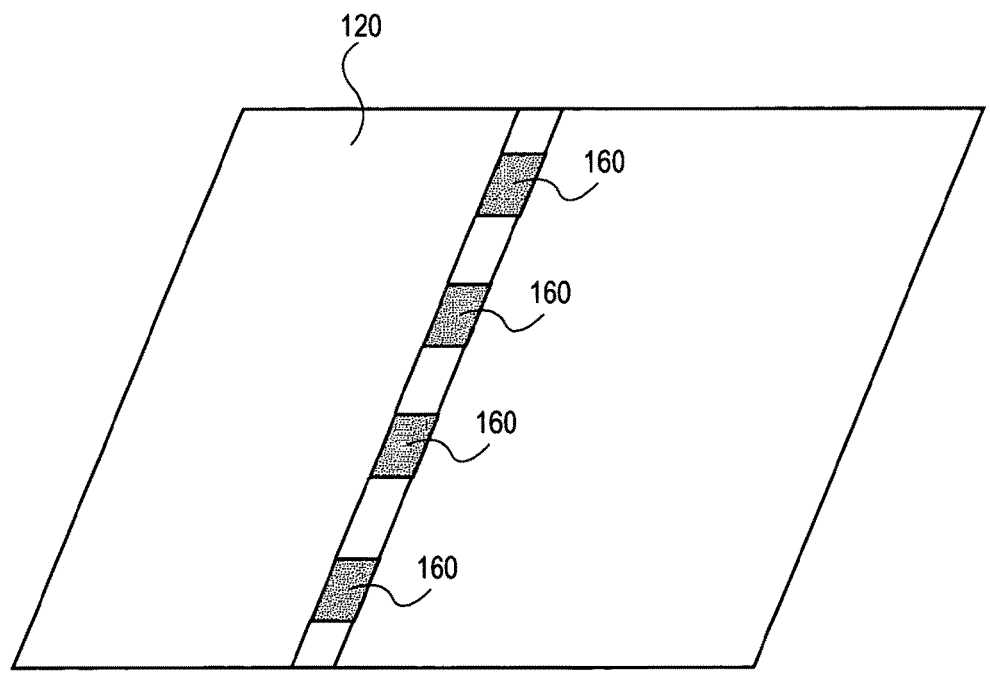
FIG. 2B is an illustration of an overhead view of an embodiment of the outside surface of a wall having a row of louvered vents.

FIGS. 2A and 2B illustrate an embodiment of angled louvered vents 110 formed in a row 105 in an external wall 120 of a mobile computing device 100. FIG. 2A illustrates a top view of the inside surface of the external wall 120. The row 105 of louvered vents 110 is seen in this figure. A row 105 of louvered vents 110 may be used to form many air curtains 130 along the inside surface of the external wall 120. The multiple air curtains 130 may in effect form a continuous air curtain 130. FIG. 2B illustrates a bottom view of the outside surface of the external wall 120 to illustrate the openings 160 of the louvered vents 110. In an alternate embodiment, not shown, a louvered vent 110 may be formed that crosses a substantial width or length of the external wall 120. Many variations of length, width, and positioning of the louvered vents 110 may be used depending on the placement of the heat generating components 140 within the mobile computing device and depending on how many air curtains are sufficient to cool the external wall 120.

Figure 2C:
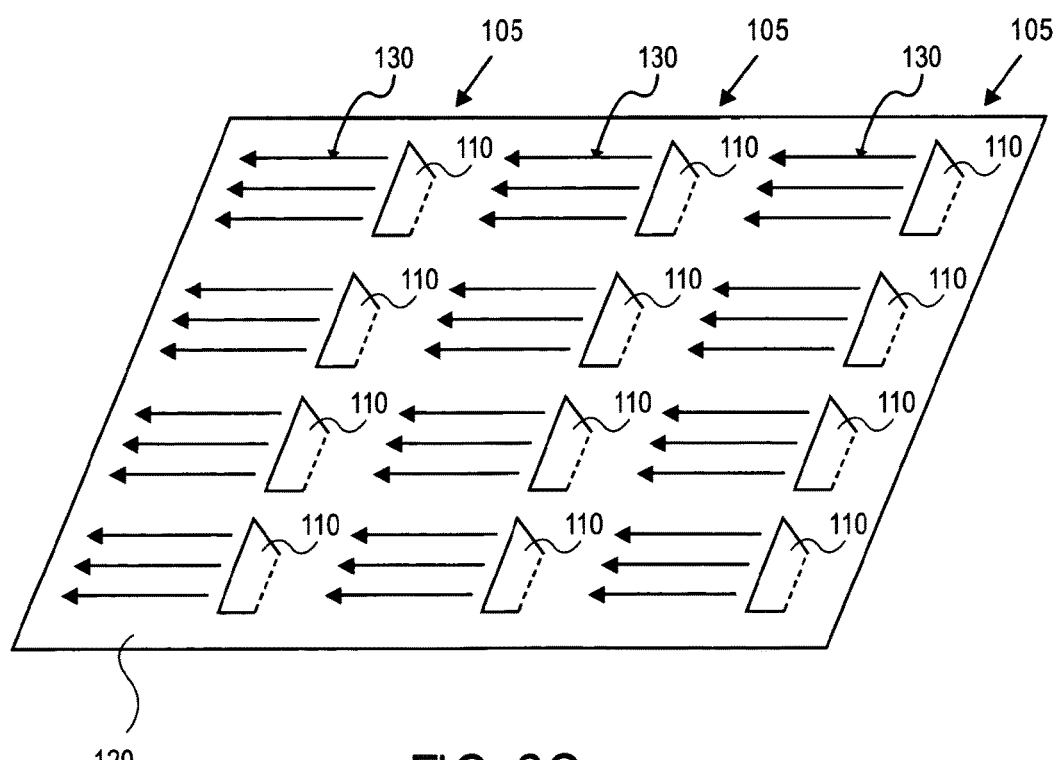
FIG. 2C is an illustration of an overhead view of an embodiment of the outside surface of a wall having a series of rows of louvered vents.

FIG. 2C illustrates an embodiment where a series of rows 105 of louvered vents 110 are positioned to create an air curtain formed of the combined series of air curtains 130 over substantially the entire external wall 120. The rows 105 of the louvered vents may be positioned approximately 10 mm-30 mm apart. The distance between the rows 105 of louvered vents 110 is determined by the distance at which the air curtain begins to break up so that the next row 105 of louvered vents 110 can take over to form an air curtain over the external wall 120 to cool the external wall 120.

In an embodiment, the positioning of the louvered vents 110 may be determined by the placement of the heat generating components within the mobile computing device 100. In this embodiment, the louvered vents 110 may be positioned to one side of the heat generating components 140 so that an air curtain 130 is formed substantially beneath the heat generating components 140 as illustrated in FIG. 1A. The louvered vents 110 described in these embodiments may decrease the temperature of the external wall 120 by approximately 20%-25% or more. The amount by which the temperature of the external wall 120 is decreased may vary depending on the type of louvered vent 110, the number of louvered vents 110, and the positioning of the louvered vents 110.

The louvered vents 110 may be formed within the external wall 120 by machining, stamping, or molding, for example. The louvered vents 110 may be formed of any material such as plastic polymers or metal. In one embodiment, the louvered vents 110 are formed of metal and have a length sufficient to provide electromagnetic interference (EMI) shielding.

Figure 3A:
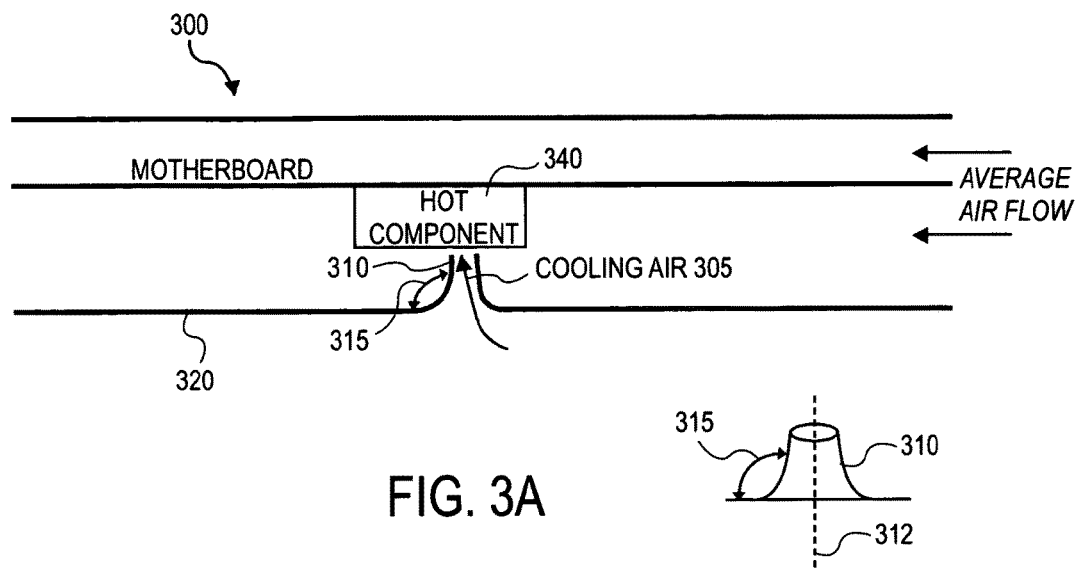
FIG. 3A is an illustration of a cross-sectional view of an embodiment of a nozzle vent within a mobile computing device.

FIG. 3A illustrates an embodiment of a mobile computing device 300 having a nozzle vent 310. The mobile computing device 300 has a heat generating component 340 and an external wall 320 near the heat generating component 340. The nozzle vent 310 is formed within the external wall 320 to flow cooling air at the heat generating component 340. By directing the flow of the cooling air 305 through the nozzle vent 310, significant heat transfer rates between the cooling air 305 and the heat generating component 340 can be achieved. Additionally, the use of the available cooling air is maximized. In one embodiment, the center vertical axis 312 of the nozzle vent 310 of FIG. 3A may be at a 90 degree angle with respect to the external wall 320 and pointed directly at the heat generating component 340. In an alternate embodiment, the center vertical axis 312 of the nozzle vent 310 may be angled with respect to the external wall 320. The angle 315 that is formed between the external wall 320 and the center vertical axis 312 of the nozzle jet may be between approximately 30 degrees and 90 degrees, and more particularly approximately 45 degrees. The nozzle vent 310 may be angled to direct the cooling air 305 at the heat generating component 340 to bring the cooling air 305 into contact with as much surface area of the heat generating component 340 as possible.

Figure 3B:
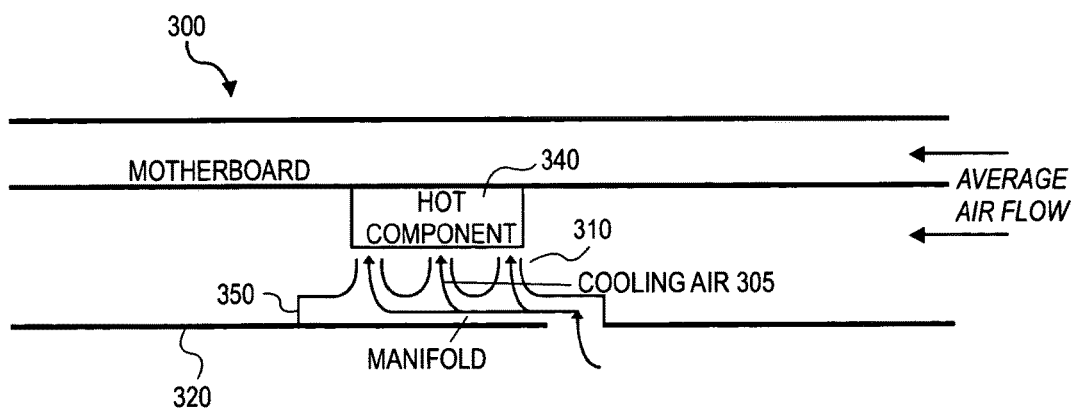
FIG. 3B is an illustration of a cross-sectional view of an embodiment of a manifold of nozzle vents.

FIG. 3B illustrates an embodiment of a mobile computing device 300 where a manifold 350 of nozzle vents 310 is used to distribute the cooling air 305 to specific locations of a heat generating component 340. The manifold 350 may also be used to direct cooling air 305 to more than one heat generating component 340. The nozzle vents 310 that are part of the manifold 350 may also be arranged at various angles relative to the external wall 320 to direct the cooling air 305 to strategic locations to maximize the cooling of the heat generating components 340.

Figure 4A:
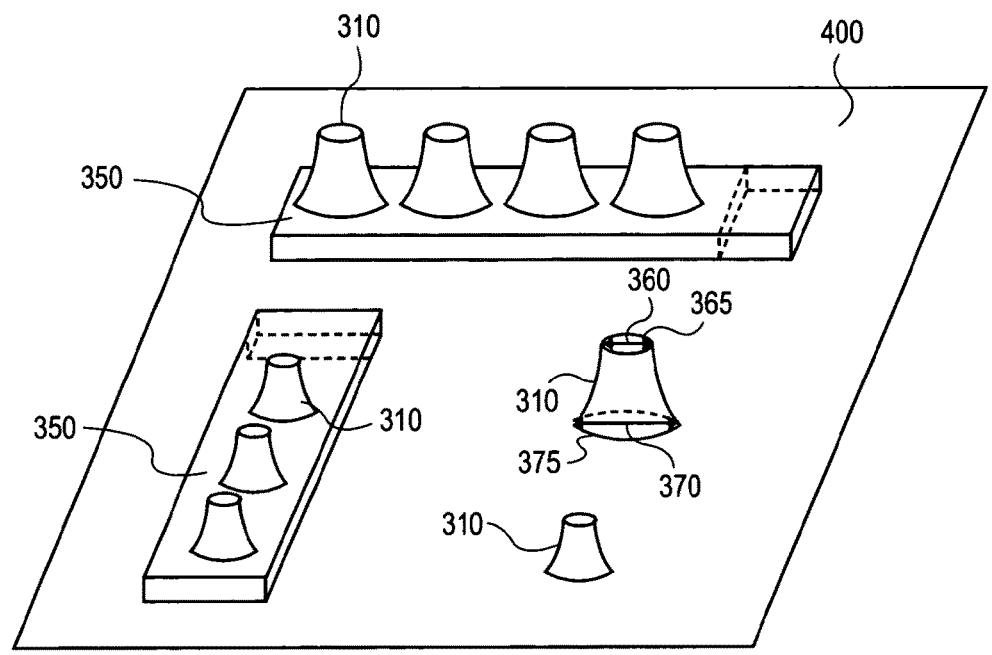
FIG. 4A illustrates an embodiment of an inside view of a wall having nozzle vents.
Figure 4B:
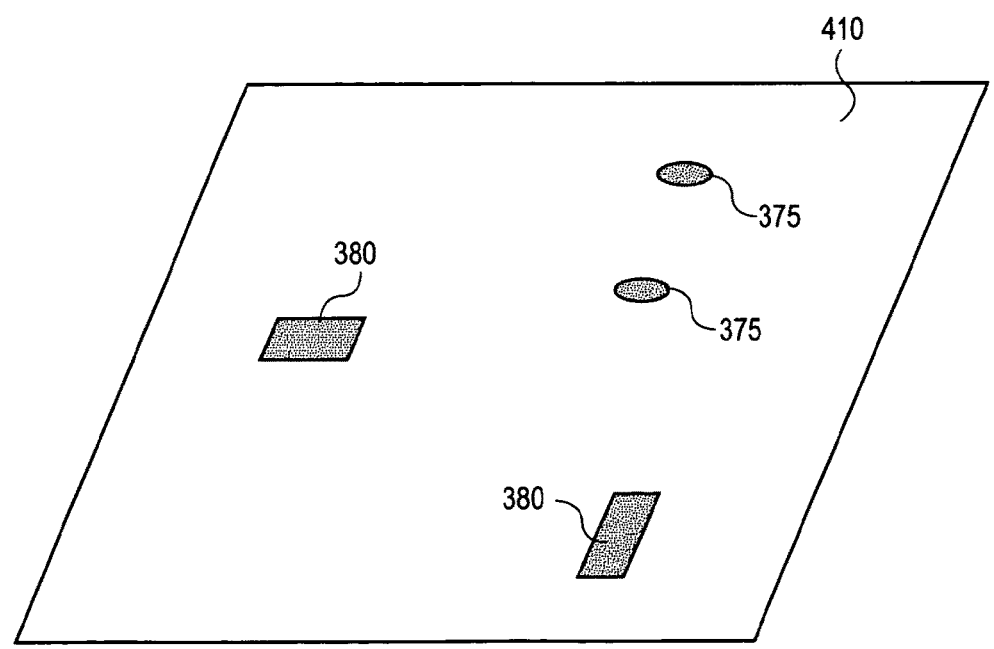
FIG. 4B is an illustration of an embodiment of an outside view of a wall having nozzle vents.

FIGS. 4A and 4B illustrate an embodiment of an external wall 320 of a mobile computing device 300. The external wall 320 of the FIGS. 4A and 4B has two manifolds 350 of nozzle vents 310 and two individual nozzle vents 310. These figures illustrate a portion of an embodiment of an external wall and are not meant to be limiting in any way. FIG. 4A illustrates the inside surface 400 of an external wall 320. The inside surface of the external wall 320 may have any arrangement of individual nozzles 310 and nozzle manifolds 350 possible, depending on the layout of the heat generating components 340 within the mobile computing device 300.

FIG. 4A illustrates one example of an outside surface 410 of the external wall 320 having one possible layout of nozzle vents 310. In one embodiment each of the nozzle vents 310 within the mobile computing device may have the same dimensions. In another embodiment, the dimensions of the nozzle vents 310 within the mobile computing device 300 may vary depending on the size of the heat generating components 340. The diameter 360 of the openings 365 and the diameter of the base 370 of the nozzle vents 310 may vary depending on the amount of cooling air 305 needed to cool down the heat generating components to a temperature sufficient to prevent the excessive heating of the external wall 320 of the mobile computing device. The diameter 360 of the openings 365 of the nozzle vents 310 and the diameter of the base 370 of the nozzle vents 310 may be varied depending on the size of the heat generating components 340 and the amount of cooling air 305 needed. In one embodiment, the diameter of the openings 365 of the nozzle vents may be in the approximate range of 2 millimeters (mm) and 5 mm and the diameter of the base 370 of the nozzle vents may be in the approximate range of 5 mm and 10 mm.

Alternatively a manifold 350 of nozzle vents 310 may be used to provide the necessary amount of cooling air 305. FIG. 4A illustrates two examples of a manifold 350 of nozzle vents 310. The manifolds 350 may have any number of nozzle vents 310 depending on the size and/or number of heat generating components 340 within the mobile computing device. The dimensions of the nozzle vents 310 that are part of a manifold 350 may be similar or different than the dimensions of the individual nozzle vents 310 on the inside surface of the external wall 320 of a mobile computing device 300. FIG. 4B illustrates the outside of the external wall 320, illustrating the base openings 375 of the nozzle vents 310 and the manifold openings 380. In an alternate embodiment, the external wall 320 may further include one or more louvered vents 110 to form an air curtain between the external wall 320 and the heat generating components 340 to create a buffer of cooler air between the external wall 320 and the heat generating component 340.

Figure 5:
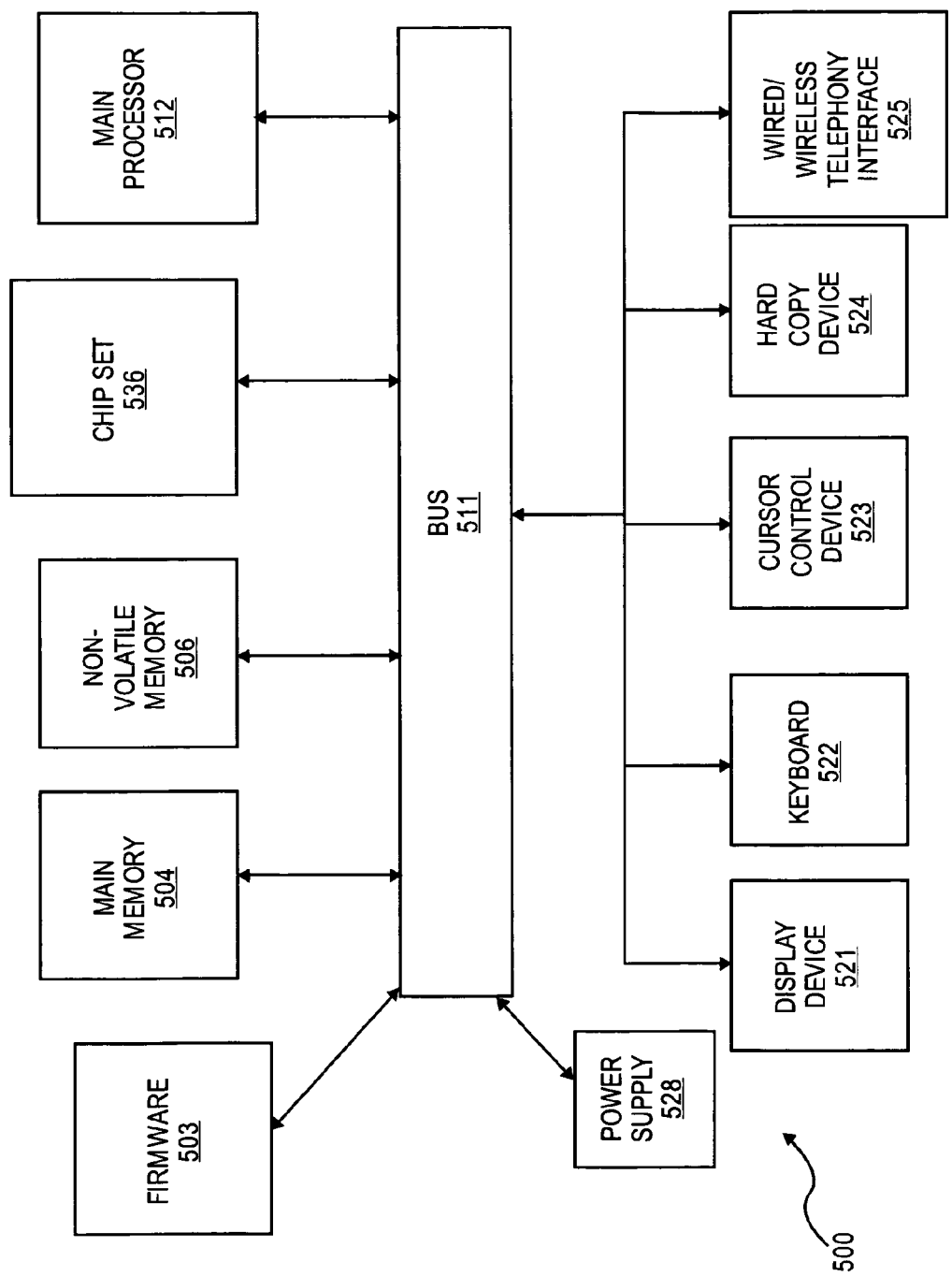
FIG. 5 is an illustration of an embodiment of a mobile computing device system that may employ embodiments of louvered vents or nozzle vents to cool the mobile computing device system.

FIG. 5 illustrates a block diagram of an example computer system that may use an embodiment of the louvered vents 110 or nozzle vents 310 to cool the external walls or heat generating components of a mobile computing device. In one embodiment, computer system 500 comprises a communication mechanism or bus 511 for communicating information, and an integrated circuit component such as a processor 512 coupled with bus 511 for processing information. One or more of the heat generating components or devices in the computer system 500 such as the processor 512 or a chip set 536 may be cooled by an embodiment of the nozzle vents 310 in combination with the louvered vents 110 to cool the external walls of the mobile computing device.

Computer system 500 further comprises a random access memory (RAM) or other dynamic storage device 504 (referred to as main memory) coupled to bus 511 for storing information and instructions to be executed by processor 512. Main memory 504 also may be used for storing temporary variables or other intermediate information during execution of instructions by processor 512.

Firmware 503 may be a combination of software and hardware, such as Electronically Programmable Read-Only Memory (EPROM) that has the operations for the routine recorded on the EPROM. The firmware 503 may embed foundation code, basic input/output system code (BIOS), or other similar code. The firmware 503 may make it possible for the computer system 400 to boot itself.

Computer system 500 also comprises a read-only memory (ROM) and/or other static storage device 506 coupled to bus 511 for storing static information and instructions for processor 512. The static storage device 506 may store OS level and application level software.

Computer system 500 may further be coupled to a display device 521, such as a cathode ray tube (CRT) or liquid crystal display (LCD), coupled to bus 511 for displaying information to a computer user. A chipset, such as chipset 536, may interface with the display device 521.

An alphanumeric input device (keyboard) 522, including alphanumeric and other keys, may also be coupled to bus 511 for communicating information and command selections to processor 512. An additional user input device is cursor control device 523, such as a mouse, trackball, trackpad, stylus, or cursor direction keys, coupled to bus 511 for communicating direction information and command selections to processor 512, and for controlling cursor movement on a display device 512. A chipset, such as chipset 536, may interface with the input output devices.

Another device that may be coupled to bus 511 is a hard copy device 524, which may be used for printing instructions, data, or other information on a medium such as paper, film, or similar types of media. Furthermore, a sound recording and playback device, such as a speaker and/or microphone (not shown) may optionally be coupled to bus 511 for audio interfacing with computer system 500. Another device that may be coupled to bus 511 is a wired/wireless communication capability 525.

Computer system 500 has a power supply 528 such as a battery, AC power plug connection and rectifier, etc.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. An apparatus comprising:
   A set of heat generating elements;
   an external wall of a housing, wherein the set of heat generating components is within the housing;
   a nozzle vent positioned on the external wall in relation to a particular heat generating component of the set of heat generating components to flow a first portion of air directly at at least a portion of the particular heat generating component; and
   a louvered vent formed on the external wall and positioned to redirect flow of a second portion of the air to within the housing between one or more of the set of heat generating components and an interior surface of the external wall of the housing.

2. The apparatus of claim 1, wherein the nozzle vent is formed on the external wall nearest to the particular heat generating component.

3. The apparatus of claim 1, wherein the nozzle vent is part of a manifold of nozzle vents on the external wall.

4. The apparatus of claim 1, wherein the louvered vent is positioned with relation to the one or more of the set of heat generating components to provide maximum cooling of the external wall.

5. The apparatus of claim 1, wherein the set of heat generating components comprises a central processing unit.

6. The apparatus of claim 1, wherein the nozzle vent extends from the interior surface of the external wall into the apparatus.

7. A method comprising:
   generating heat within a mobile computing device with a set of heat generating components, wherein the mobile computing device comprises a housing and the set of heat generating components is contained within the housing; and
   cooling the set of heat generating components by directing air from outside the mobile computing device through a louvered vent and a nozzle vent formed within an external wall of the housing, wherein the nozzle vent is positioned in relation to a particular heat generating component of the set of heat generating components to direct the air to the particular heat generating component and the louvered vent is positioned to direct flow of the air to within the housing and between at least a portion of the set of heat generating components and an interior side of the external wall of the housing.

8. The method of claim 7, wherein the nozzle vent is part of a manifold of nozzle vents, and wherein the cooling the set of heat generating components comprises flowing the air into the mobile computing device with the manifold of nozzle vents.

9. The method of claim 7, further comprising drawing the air into the mobile computing device through the louvered vent to cool the external wall opposite the at least the portion of the set of heat generating components by forming an air stream with the air.

10. The method of claim 9, further comprising creating an air stream from the air using fluid dynamic characteristics of the nozzle vent, the air stream is formed substantially perpendicular with the interior side of the external wall, the air stream in direct contact with the particular heat generating component, and wherein the nozzle vent is positioned proximate to the particular heat generating component.

11. A computing device comprising:
  a set of heat generating components;
  a housing containing the set of heat generating components, the housing having an external wall having a nozzle vent positioned in relation to a particular heat generating component of the set of heat generating components to directly cool the particular heat generating component;
  a louvered vent formed within the external wall and positioned to redirect flow of external air to within the housing between at least a portion of the set of heat generating components and an interior side of the external wall of the housing; and
  a battery to power the computing device.

12. The computing device of claim 11, wherein an axis of the nozzle vent is positioned at a 90 degree angle with respect to the external wall and pointed directly at the particular heat generating component.

13. The computing device of claim 11, further comprising:
  a plurality of nozzle vents comprising the nozzle vent, and wherein the housing has the plurality of nozzle vents formed in the external wall.

14. The computing device of claim 13, wherein the plurality of nozzle vents creates an air stream from the external air using fluid dynamic characteristics of the plurality of nozzle vents, the air stream comprising a stream of air formed substantially perpendicular with the interior side of the external wall, the air stream in direct contact with the particular heat generating component, and wherein the plurality of nozzle vents is positioned proximate to the particular heat generating component.

15. The computing device of claim 14, wherein the nozzle vent draws the external air into the computing device to form the air stream.

16. The computing device apparatus of claim 14, wherein the air stream has an area substantially similar to an area of heat created by the particular heat generating component.

17. The computing device of claim 14, wherein the air stream supplements an average airflow inside the computing device and deflects at least a portion of heat from the particular heat generating component from reaching the external wall.

18. The computing device of claim 11, wherein the nozzle vent creates an air stream from the external air using fluid dynamic characteristics of the nozzle vent, the air stream is substantially perpendicular with the interior side of the external wall to be in direct contact with the particular heat generating component, and wherein the nozzle vent is positioned proximate to the particular heat generating component.

* * * * *

UNITED STATES PATENT AND TRADEMARK OFFICE
CERTIFICATE OF CORRECTION

PATENT NO. : 10,007,308 B2
APPLICATION NO. : 14/711638
DATED : June 26, 2018
INVENTOR(S) : Rajiv K. Mongia et al.

It is certified that error appears in the above-identified patent and that said Letters Patent is hereby corrected as shown below:

On the Title Page

In item (*), Column 1, Line 3, in Notice, after "0 days.", delete "days.".

In the Claims

In Column 6, Line 30, in Claim 1, delete "A" and insert -- a -- therefor.

In Column 6, Line 30, in Claim 1, delete "elements;" and insert -- components; -- therefor.

In Column 8, Line 22 (approx.), in Claim 16, after "device", delete "apparatus".

Signed and Sealed this
Sixteenth Day of October, 2018

Andrei Iancu
*Director of the United States Patent and Trademark Office*